(12) United States Patent
Bae et al.

(10) Patent No.: US 8,795,930 B2
(45) Date of Patent: Aug. 5, 2014

(54) SELF-POLARIZED MASK AND SELF-POLARIZED MASK APPLICATION

(75) Inventors: Sanggil Bae, Clifton Park, NY (US); Ki Young Lee, Poughquag, NY (US); Tony Joung, Hopewell Junction, NY (US)

(73) Assignee: GlobalFoundries Inc., Grand Cayman (KY)

( * ) Notice: Subject to any disclaimer, the term of this patent is extended or adjusted under 35 U.S.C. 154(b) by 85 days.

(21) Appl. No.: 13/565,080

(22) Filed: Aug. 2, 2012

(65) Prior Publication Data

US 2014/0038089 A1    Feb. 6, 2014

(51) Int. Cl.
 *G03F 1/50* (2012.01)
 *G02B 27/28* (2006.01)

(52) U.S. Cl.
 USPC ............................................. 430/5; 430/322

(58) Field of Classification Search
 CPC .............. G03F 7/70566; G02B 27/286; G02F 1/133788
 USPC ............................................. 430/5, 311, 322
 See application file for complete search history.

(56) References Cited

U.S. PATENT DOCUMENTS

2002/0172893 A1*  11/2002  Kozenkov et al. ............ 430/321
2006/0121360 A1*   6/2006  Wu .................................. 430/5

* cited by examiner

*Primary Examiner* — Stephen Rosasco
(74) *Attorney, Agent, or Firm* — Ditthavong & Steiner, P.C.

(57) ABSTRACT

A self-polarized mask is provided including a transparent substrate, first and second layers of polarization material consecutively provided on the transparent substrate and polarized in a first and a second direction, respectively. A first region is provided that extends in the first direction and contains only the first layer and no second layer, a second region is provided that extends in the second direction and contains only the second layer and no first layer. Embodiments include exposing a photoresist to light through the mask such that light polarized in the first direction passes through the mask in the first region to expose a first-directional region of the photoresist layer used to form a first-directional semiconductor device structure, and light polarized in the second direction passes through the mask in the second region to expose a second-directional region of the photoresist layer used to form a second-directional semiconductor device structure.

20 Claims, 8 Drawing Sheets

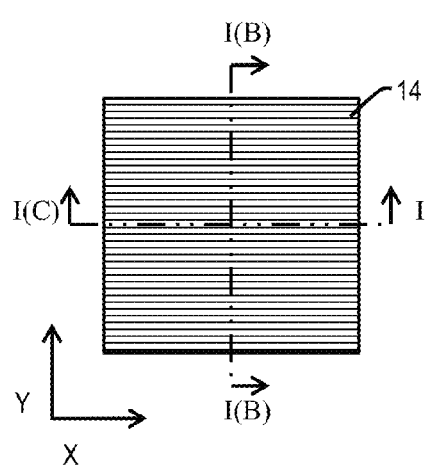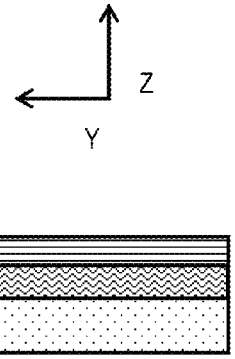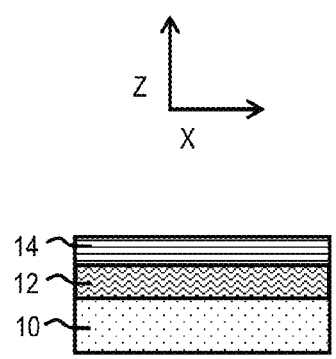
FIG. 1A    FIG. 1B    FIG. 1C
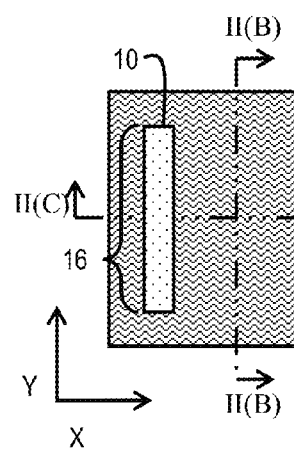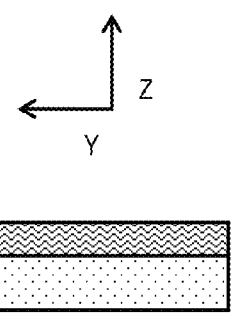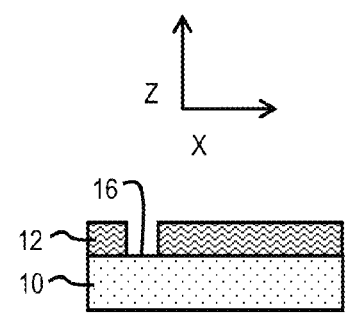
FIG. 2A    FIG. 2B    FIG. 2C

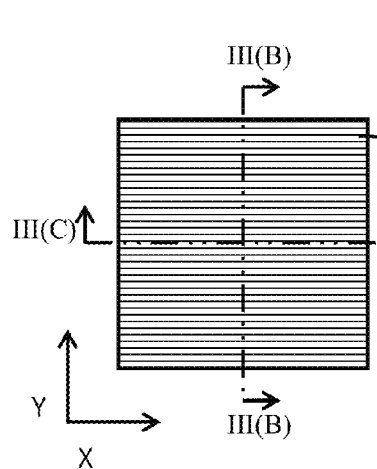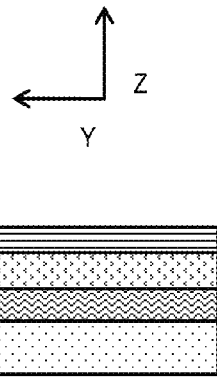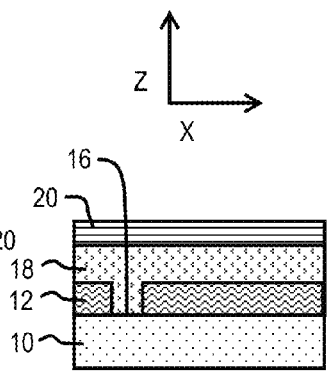
FIG. 3A	FIG. 3B	FIG. 3C
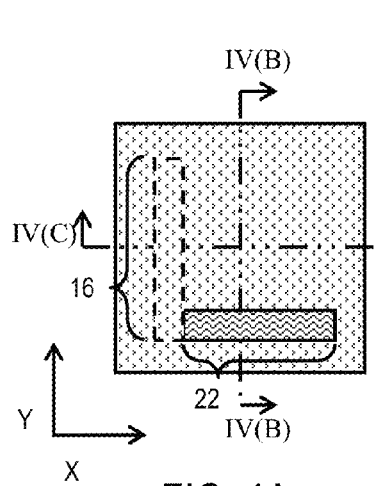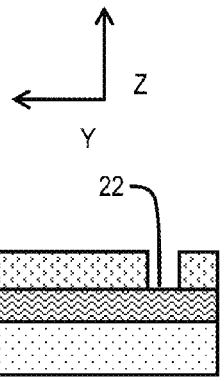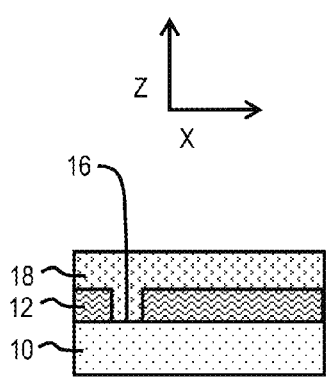
FIG. 4A	FIG. 4B	FIG. 4C

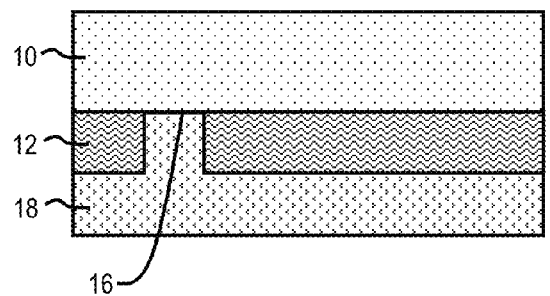
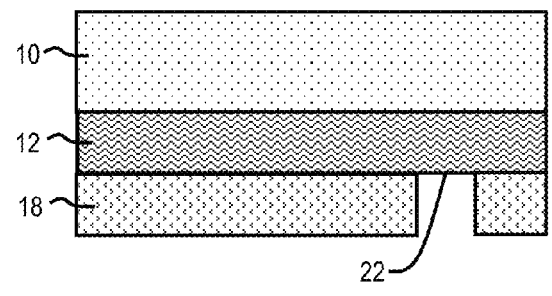
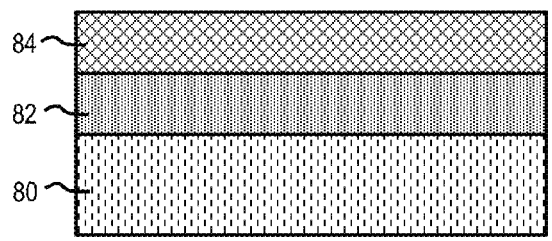
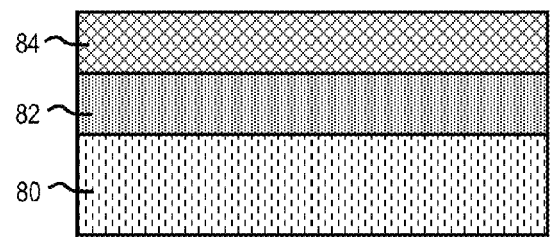
FIG. 8A					FIG. 8B

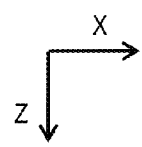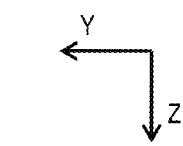
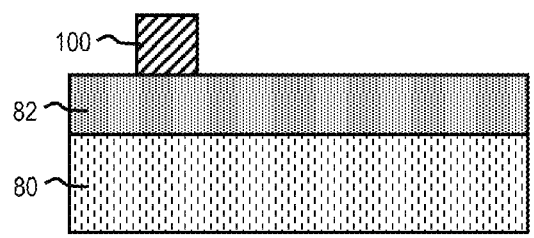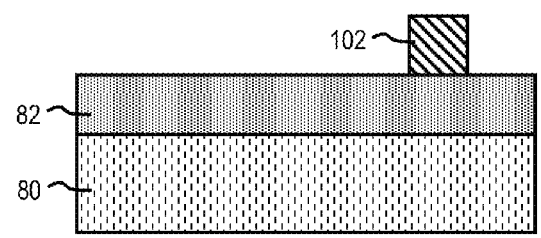
FIG. 10A                FIG. 10B
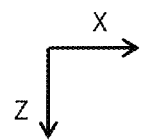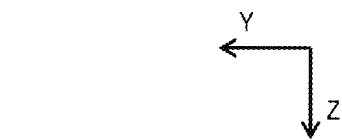
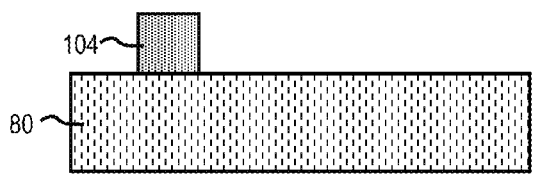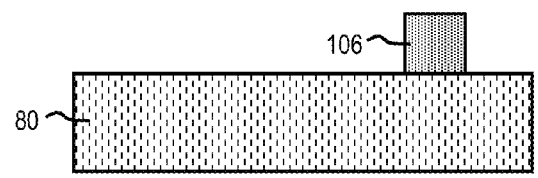
FIG. 11A                FIG. 11B

SELF-POLARIZED MASK AND SELF-POLARIZED MASK APPLICATION

TECHNICAL FIELD

The present disclosure relates to fabrication of semiconductor devices, and more particularly to devices in having an 80 nanometer (nm) pitch and below.

BACKGROUND

Conventional processes for forming semiconductor devices, such as CMOS devices, involve photolithographic patterning processes to illuminate regions of a photoresist layer, which can then be used to etch semiconductor device structures. A mask is used to define which regions of the photoresist layer are illuminated during the patterning process and which regions are not.

As semiconductor design rules shrink down to 32 nm technology node, or even further down to the 20 nm technology node, most critical levels of the manufacturing process are using polarized illumination for fine pitch patterning to obtain better image contrast, which can result in better resolution and edge control. For example, as can be seen in FIG. 13A, when polarized light 200 is directed through a mask (not shown) on quartz material (not shown), a pattern on the mask can be used to form Y direction structural lines 202 and X direction structural lines 204 on a substrate 206. However, the use of such polarized light only allows for very fine structures that extend in the Y direction (i.e. the same direction as the polarized light), as shown by the Y direction structural lines 202 in FIG. 13B. However, by using such a Y direction polarized light, structures that extend in the X direction do not have the same resolution as in the Y direction, as shown by the X direction structural lines 204 in FIG. 13C.

Thus, while polarization is one way to help to resolve patterns in smaller technology nodes, current methods sacrifice the resolution of patterns that extend in directions different from the direction of polarization. For example, for 20LPM (low power manufacturing) gate line, the minimum pitch allowed for a direction orthogonal to the polarization direction is three times wider than the polarization direction. For fine pitch in both directions, such as for a 20LPM metal 1 layer, double exposure, using two masks, must be employed.

A need therefore exists for methodology enabling the cost-effective and efficient photolithographic fabrication of semiconductor devices having high resolution in all directions using a single exposure with a single mask, the mask, and the method of fabricating the mask.

SUMMARY

An aspect of the present disclosure is a method of forming a semiconductor device with high resolution in multiple directions using a single exposure and single mask.

Another aspect of the present disclosure is a method of forming a mask that passes light polarized in one direction in a first region and a light polarized in a second direction in a second region.

Another aspect of the present disclosure is a mask that passes light polarized in one direction in a first region and a light polarized in a second direction in a second region.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including providing a mask including: a transparent substrate; a first layer of a polarization material provided on the transparent substrate, the first layer formed to allow light polarized in a first direction to travel therethrough; and a second layer of a polarization material provided on the first layer, the second layer formed to allow light polarized in a second direction to travel therethrough, the second direction being at an angle to the first direction, wherein a first region is provided that extends in the first direction and contains the first layer and no second layer, and wherein a second region is provided that extends in the second direction and contains the second layer and no first layer; and exposing a photoresist to light through the mask such that light polarized in the first direction passes through the first region to expose a first-directional region of the photoresist layer, and light polarized in the second direction passes through the second region to expose a second-directional region of the photoresist layer.

Aspects include the mask further including a third region that extends in a third direction and contains a third layer of a polarization material, the third layer formed to allow light polarized in the third direction to travel therethrough, the third direction being at an angle to the first and second directions, the third region not containing the first or second layers, and the first and second regions containing no third layer, wherein exposing the photoresist layer to light through the mask allows light polarized in the third direction to pass through the third region to expose a third-directional region of the photoresist layer. Further aspects include the first direction and the second direction being perpendicular to one another, and the third direction being at a 45° angle to the first direction and the second direction. Other aspects include the first direction and the second direction being perpendicular to one another. Another aspect includes the first layer being formed from a dichroic material deposited with an orientation to allow the light polarized in the first direction to travel therethrough, and the second layer being formed from the dichroic material deposited with an orientation to allow light polarized in the second direction to travel therethrough. Additional aspects include the first region containing elongated sides that extend in the first direction, and the second region containing elongated sides that extend in the second direction. Further aspects include a masking region containing both the first and second layers being provided in an area not including the first region and the second region.

Another aspect of the present disclosure includes a mask including a transparent substrate; a first layer of polarization material provided on the transparent substrate, the first layer formed to allow light polarized in a first direction to travel therethrough; and a second layer of polarization material provided on the first layer, the second layer formed to allow light polarized in a second direction to travel therethrough, the second direction being at an angle to the first direction, wherein a first region is provided that extends in the first direction and contains the first layer and no second layer, and wherein a second region is provided that extends in the second direction and contains the second layer and no first layer.

Aspects include a third region extending in a third direction and containing a third layer of a polarization material, the third layer formed to allow light polarized in the third direction to travel therethrough, the third direction being at an angle to the first and second directions, wherein the third region does not contain the first or second layers, and wherein the first and second regions contain no third layer. Further aspects include the first direction and the second direction being perpendicular to one another, and the third direction being at a 45° angle to the first direction and the second direction. Another aspect includes the first direction and the second direction being perpendicular to one another. Other aspects include the first layer being formed from a dichroic material deposited with an orientation to allow light polarized in the first direction to travel therethrough, and the second layer being formed from the dichroic material deposited with an orientation to allow light polarized in the second direction to travel therethrough. Additional aspects include the first region containing elongated sides that extend in the first direction, and the second region containing elongated sides that extend in the second direction. Further aspects include a masking region containing both the first and second layers being provided in an area not including the first region and the second region.

Another aspect of the present disclosure includes a method including providing a transparent substrate; forming a first layer of a polarization material on the transparent substrate, the polarization material of the first layer being oriented to allow light polarized in a first direction to travel therethrough; removing the first layer from a first region extending in a second direction that is at an angle to the first direction; forming a second layer of a polarization material on the first layer and in the region, the polarization material of the second layer being oriented to allow light polarized in the second direction to travel therethrough; and removing the second layer from a second region extending in the first direction.

Aspects include removing both the first layer and the second layer from a third region extending in a third direction that is at an angle to the first and second directions; and forming a third layer of a polarization material in the third region, the polarization material of the third layer being oriented to allow light polarized in the third direction to travel therethrough. Other aspects include the first direction and the second direction being perpendicular to one another, and the third direction being at a 45° angle to the first direction and the second direction. Another aspect includes the first direction and the second direction being perpendicular to one another. Additional aspects include forming the first layer by depositing a dichroic material with an orientation to allow light polarized in the first direction to travel therethrough, and forming the second layer by depositing the dichroic material with an orientation to allow light polarized in the second direction to travel therethrough. Further aspects include the first region containing elongated sides that extend in the second direction, and the second region containing elongated sides that extend in the first direction.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 4C schematically illustrate a method of manufacturing a self-polarized mask, according to an exemplary embodiment;

FIGS. 8A through 11B schematically illustrate a method of using a self-polarized mask to form a semiconductor device, according to an exemplary embodiment;

DETAILED DESCRIPTION

Figure 5:
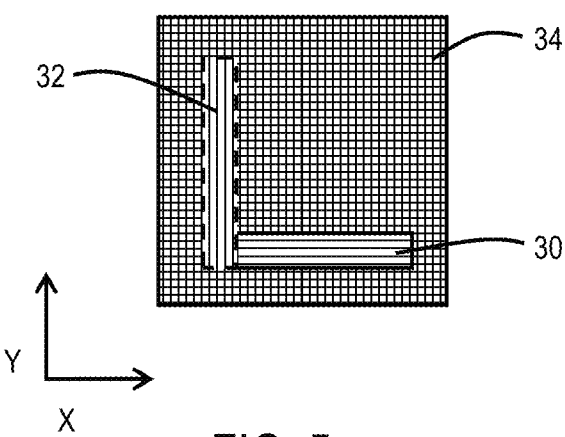
FIG. 5 illustrates a plan view of a self-polarized mask formed using the process depicted in FIGS. 1A through 4C, according to an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present invention addresses and solves the problem of needing multiple masks and exposures attendant upon forming structures requiring high resolution in multiple directions. In accordance with embodiments of the present disclosure, a mask is formed using multiple layers of polarization material, each polarized in a different direction. The mask includes a first region extending in a first direction and only including material polarized in that direction a second region extending in a second direction and including only material polarized in the second direction. When the first and second directions are perpendicular to each other, the area not in the first and second regions acts as a light block by including both layers of material. The mask is used to pattern a photoresist with regions corresponding to the first and second regions of the mask, which in turn is used to etch a semiconductor device having portion extending in the two directions and corresponding to the first and second regions of the mask.

Embodiments of the invention provide numerous advantages. For example, with such embodiments, a self-polarizing mask is provided that can enable fine pitch patterning with a single masking process. Also, the embodiments allow for chip size to be shrunk down due to the ability to achieve high resolution of patterns that extend in different directions. These embodiments enable the cost-effective and efficient photolithographic fabrication of semiconductor devices having high resolution in all directions.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 4C schematically illustrate a method of manufacturing a self-polarized mask, according to an exemplary embodiment.

FIG. 1A depicts a plan view of a step of forming the self-polarized mask, and FIGS. 1B and 1C depict cross-sectional views taken along cross-sectional lines I(B)-I(B) and I(C)-I(C), respectively, shown in FIG. 1A. In FIGS. 1A through 1C, a transparent substrate 10 (e.g., fused silica) of the mask is provided, and a first layer 12 of polarization material is provided on the transparent substrate 10. The first layer 12 is formed to allow light polarized in a first direction to travel through the first layer 12. For example, the first layer 12 can be formed from a dichroic material deposited with an orientation to allow light polarized in the first direction to travel therethrough. In the embodiment depicted, first layer 12 is formed to allow light polarized in an X direction to pass through the first layer 12. A photoresist layer 14 is then provided on the first layer of first-directional polarization material 12.

FIG. 2A depicts a plan view of the next step of forming the self-polarized mask, and FIGS. 2B and 2C depict cross-sectional views taken along cross-sectional lines II(B)-II(B) and II(C)-II(C), respectively, shown in FIG. 2A. The photoresist layer 14 of FIGS. 1A through 1C is patterned (not shown) by masking, illuminating, and etching, and then employed to remove the first layer of the polarization material from a region 16 of the first layer 12, as shown in FIGS. 2A through 2C. The region 16 extends in a second direction that is at an angle to the first direction. In the embodiment depicted, the region 16 extends in a Y direction.

FIG. 3A depicts a plan view of another step of forming the self-polarized mask, and FIGS. 3B and 3C depict cross-sectional views taken along cross-sectional lines III(B)-III(B) and III(C)-III(C), respectively, shown in FIG. 3A. A second layer 18 of polarization material is formed on the first layer 12 and in the region 16. The second layer 18 is formed to allow light polarized in the second direction to travel through the second layer 18. The second direction is at an angle to the first direction. For example, the second layer 18 of polarization material can be formed from a dichroic material (either the same material as or a different material from the first layer 12) deposited with an orientation to allow the light polarized in the second direction to travel through the second-directional polarization material. While this embodiment depicts the materials 12 and 18 being oriented to allow light polarized in orthogonal directions to one another to pass respectively there through, any directions can be used provided that they are at an angle to one another. Next, a photoresist layer 20 is provided on the second layer 18.

FIG. 4A depicts a plan view of a subsequent step of forming the self-polarized mask, and FIGS. 4B and 4C depict cross-sectional views taken along cross-sectional lines IV(B)-IV(B) and IV(C)-IV(C), respectively, shown in FIG. 4A. The photoresist layer 20 of FIGS. 3A through 3C is patterned (not shown) by masking, illuminating, and etching, and then used to remove the second layer of polarization material from a region 22 of the second layer 18, as shown in FIGS. 4A through 4C. The region 22 extends in the first direction. Thus, in the exemplary embodiment depicted, the region 22 extends in the X direction. While this example depicts the regions 16 and 22 being oriented in orthogonal directions to one another, any directions can be used as long as they are at an angle to one another and as long as elongation directions of the regions match the orientation directions of the respective layers of polarization material.

Adverting to FIG. 5, a plan view is illustrated of a self-polarized mask formed using the process depicted in FIGS. 1A through 4C, according to an exemplary embodiment. The process provides a region 30 (equivalent to region 22 of FIG. 4A) that extends in an X direction and contains polarization material polarized in the X-direction and no polarization material polarized in the Y-direction. The process further provides a region 32 (equivalent to region 16 of FIG. 4A) that extends in a Y direction and contains polarization material polarized in the Y-direction and no polarization material polarized in the X-direction. The remainder of the mask, a region 34, contains a layer of polarization material polarized in the X-direction and a layer of polarization material polarized in the Y-direction. Region 34 is a masking region that is provided in areas not including regions 30 and 32, which effectively blocks or absorbs all light that is directed onto region 34 using the combination of X-polarized and Y-polarized materials.

Figure 6:
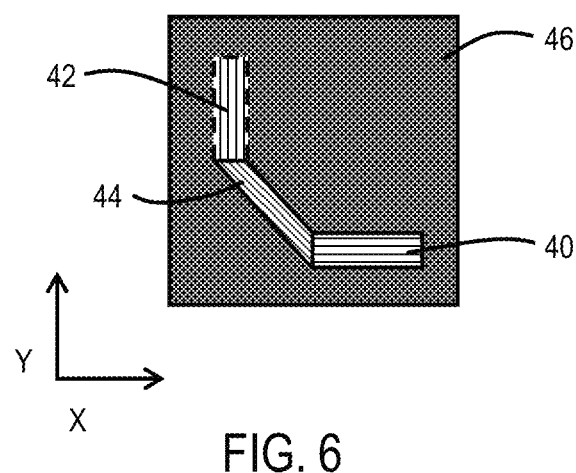
FIG. 6 illustrates a plan view of a self-polarized mask, according to a further exemplary embodiment.

FIG. 6 illustrates a plan view of a self-polarized mask, according to a further exemplary embodiment. The self-polarized mask includes a region 40 that extends in an X direction and contains only X-polarized material and no material polarized in the Y-direction or other directions. The self-polarized mask further includes a region 42 that extends in a Y direction and contains only Y-polarized material and no material polarized in the X-direction or other directions. The self-polarized mask further includes a region 44 that extends in a direction that is at a 45° angle to the X direction and the Y direction. The region 44 contains only polarized material that is oriented at the 45° angle to the X and Y directions, and no X- or Y-polarized materials. The self-polarized mask further includes a region 46 that contains both X-polarized material and Y-polarized material. Region 46 is a masking region that is provided in an area not including regions 40, 42, and 44, and which effectively blocks or absorbs all light that is directed onto region 46 using the combination of the X- and Y-polarized materials.

Figure 7A:
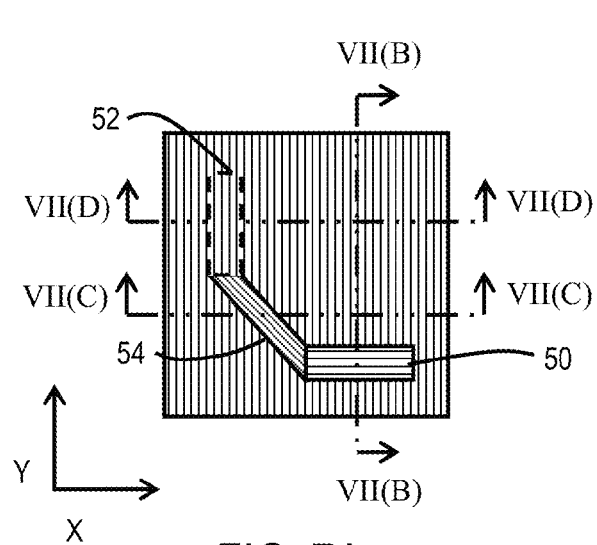
FIGS. 7A through 7D illustrate a self-polarized mask depicted in plan view in FIG. 7(A) and in various cross-sectional views in FIGS. 7B through 7D, according to an exemplary embodiment.
Figure 7B:
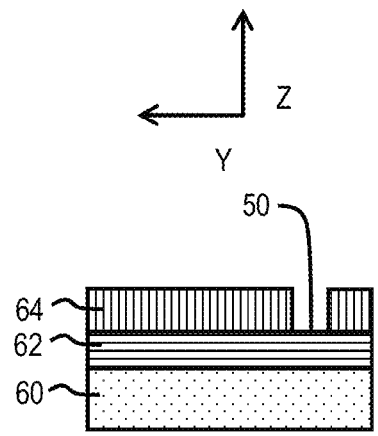
Figure 7C:
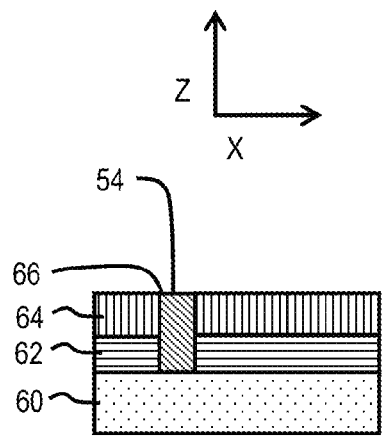
Figure 7D:
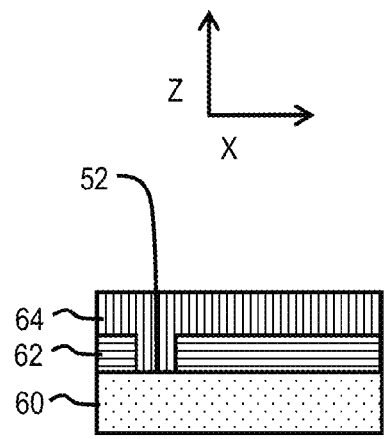

FIGS. 7A through 7D illustrate a self-polarized mask, such as is depicted in FIG. 6. FIG. 7A depicts in plan view, and FIGS. 7B through 7D depict cross-sectional views taken along cross-sectional lines VII(B)-VII(B), VII(C)-VII(C), and VII(D)-VII(D), respectively. As can be seen in FIGS. 7A through 7D, the self-polarized mask includes a transparent substrate 60, a first layer 62 of polarization material polarized in a first direction (e.g., in an X direction) formed on the transparent substrate 60, and a second layer 64 of polarization material polarized in a second direction (e.g., in a Y direction) formed on the first layer 62. A region 50 is provided that extends in the X direction and that contains only X-polarized material and no other polarization material. A region 52 is provided that extends in the Y direction and that contains only Y-polarized material and no other polarization material. Further, a region 54 is provided that extends in a direction that is at a 45° angle to the X direction and the Y direction, and that contains only polarization material that is oriented at the 45° angle to the X and Y directions and contains no other polarization material. The regions 50 and 52 can be formed in a similar manner as regions 22 and 16, respectively. Region 54 can be formed by etching in layers 62 and 64, and then depositing therein the polarization material that is oriented at the 45° angle to the X and Y directions.

As can be seen from FIGS. 7A through 7D, any variety of regions can be formed in the same manner as region 54 to extend in any direction with polarization material that is oriented to match that direction to form any variety of complex shapes. The regions are each formed to extend in a direction in which the region contains elongated sides. As a result, the self-polarized mask can be utilized to form semiconductor device structures having high resolution along such elongated sides to maximize the resolution of the outline of the device structures formed.

FIGS. 8A through 11B schematically illustrate a method of using a self-polarized mask to form a semiconductor device, according to an exemplary embodiment.

FIGS. 8A and 8B show cross-sectional views of the self-polarized mask of FIGS. 4A through 4C in an inverted manner in the orientations noted by the X-Y-Z axes shown in the figures. The self-polarized mask is aligned over a semiconductor substrate 80 having an oxide layer 82 formed thereon, and a photoresist layer 84 formed on the oxide layer 82.

Figure 9A:
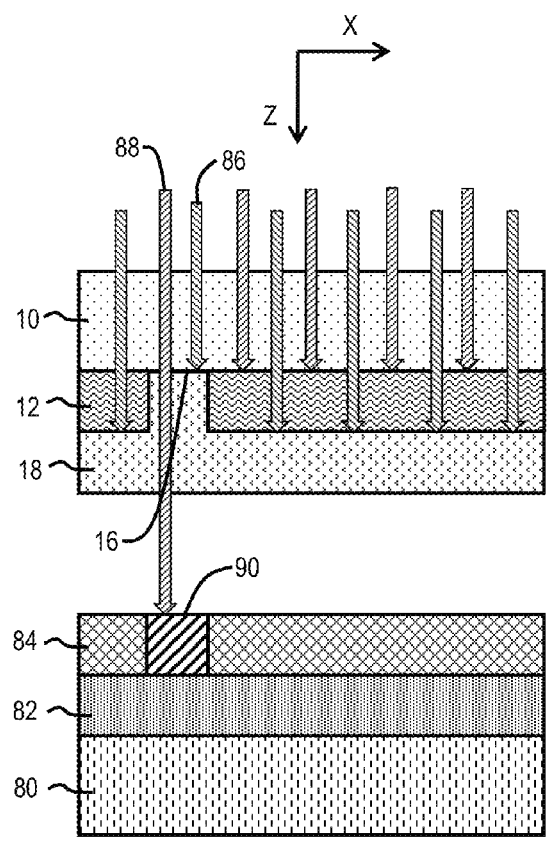
Figure 9B:
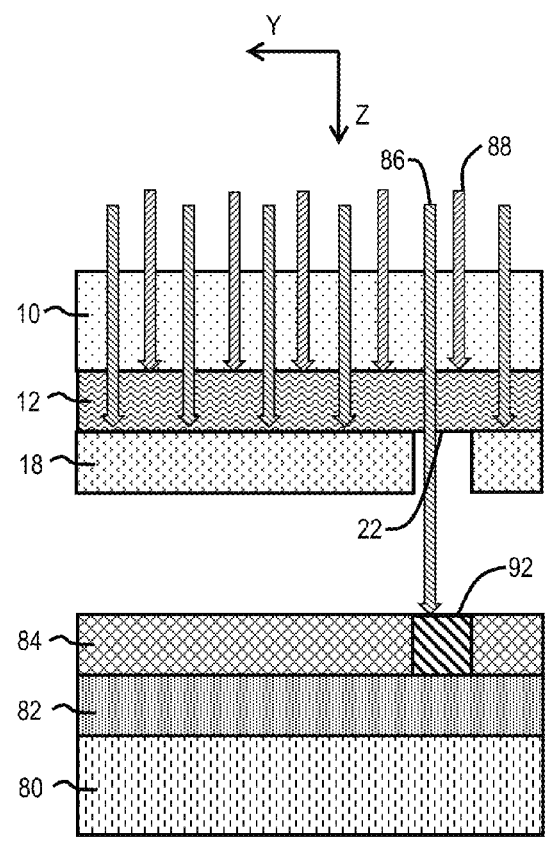

In FIGS. 9A and 9B, the mask is exposed to light. While the light used is preferably non-polarized light, FIGS. 9A and 9B only depict alternating X-polarized light components 86 and Y-polarized light components 88 for simplicity of illustration. The X-polarized light components 86 and the Y-polarized light components 88 both travel through the transparent substrate 10. The X-polarized light components 86 continue through the X-polarized layer 12 with little or no absorption, but they are substantially or completely absorbed by the Y-polarized layer 18 and, therefore, do not travel therethrough. The Y-polarized light components 88 travel through the Y-polarized layer 18 with little or no absorption, but they are substantially or completely absorbed by the X-polarized layer 12 and, therefore, do not travel therethrough. Thus, by exposing the mask to light, the X-polarized light components 86 will be prevented from passing through the mask in all regions except for region 22, and the Y-polarized light components 88 will be prevented from passing through the mask in all regions except for region 16.

Accordingly, the Y-polarized light components 88 travelling through region 16 will expose a region 90 of the photoresist layer 84 extending in the Y-direction and be used to form a semiconductor device structure extending in the Y-direction, and the X-polarized light components 86 travelling through region 22 will expose a region 92 of the photoresist layer 84 extending in the X-direction and be used to form a semiconductor device structure extending in the X-direction. Once regions 90 and 92 are exposed to their respective light components, the regions 90 and 92 can be cured, and remaining portions of the photoresist layer 84 can be removed by a solution to leave the regions 100 and 102, respectively, as shown in FIGS. 10A and 10B. Regions 100 and 102 can be used to etch exposed portions of oxide layer 82 to form semiconductor device structures 104 and 106, extending in the Y- and X-directions, respectively, as shown in FIGS. 11A and 11B.

Figure 12:
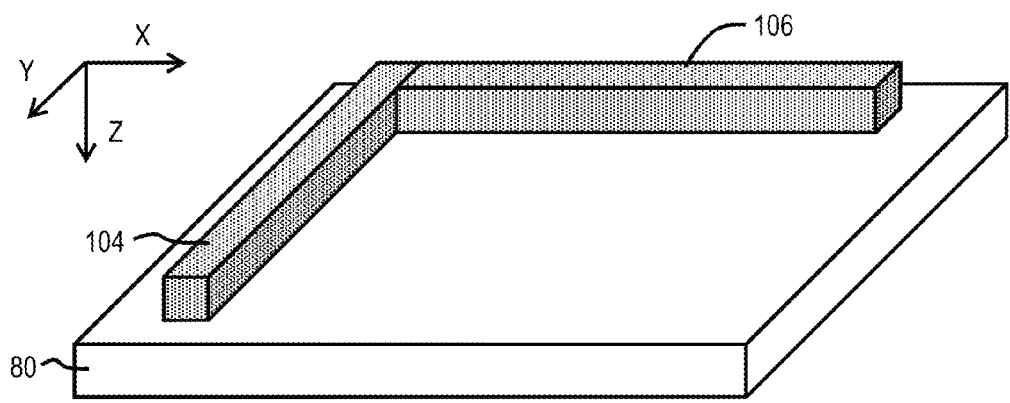
FIG. 12 depicts a semiconductor device formed using the process depicted in FIGS. 8A through 11B, according to an exemplary embodiment.
Figure 13A:
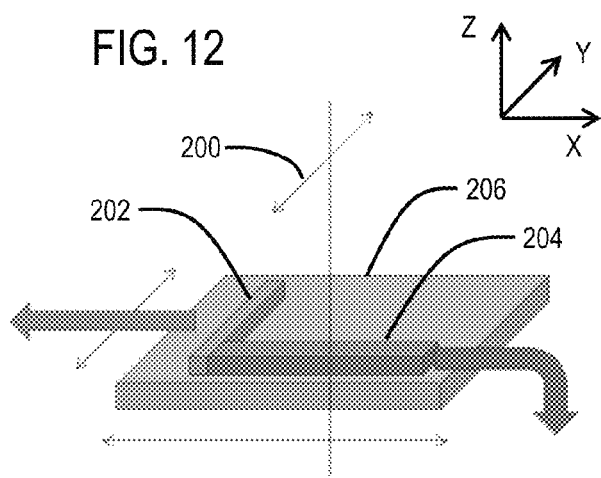
FIG. 13A illustrates a dichroic material used to polarize light along a Y direction.
Figure 13B:
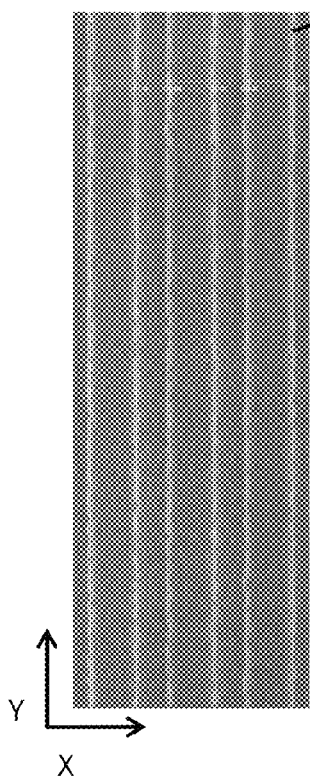
FIG. 13B depicts Y direction structural lines formed using such a dichroic material and conventional processes.
Figure 13C:
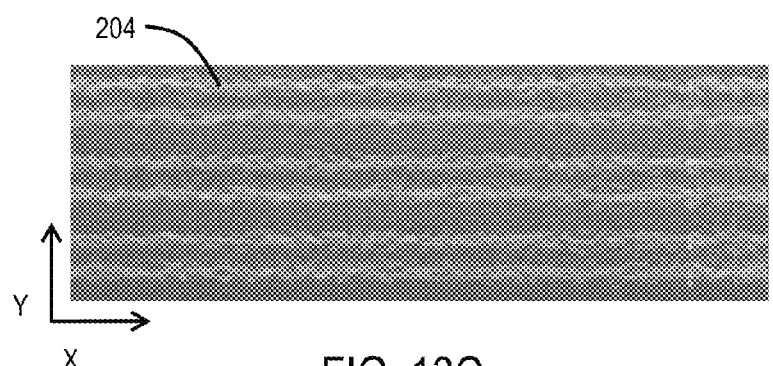
FIG. 13C depicts X direction structural lines formed using such a dichroic material and conventional processes.

FIG. 12 provides a perspective view of a semiconductor device including X-directional semiconductor device structure 106 and Y-directional semiconductor device structure 104 formed using the process depicted in FIGS. 8A through 11B, according to an exemplary embodiment. As noted above, any number of regions can be formed using the above techniques to form any variety of complex shapes for the semiconductor device(s). The regions are each formed to extend in a direction in which the region contains elongated sides, resulting in a self-polarized mask that can be utilized to form semiconductor device structures having high resolution along such elongated sides in order to maximize the resolution of the outline of the device structures formed.

The embodiments of the present disclosure can achieve several technical effects, particularly in enabling the cost-effective and efficient photolithographic fabrication of semiconductor devices having high resolution in all directions. Embodiments of the invention provide numerous advantages. For example, with such embodiments, a self-polarizing mask is provided that can enable fine pitch patterning with a single masking process. Also, the embodiments allow for chip size to be shrunk down due to the ability to achieve high resolution of patterns that extend in different directions. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for devices having an 80 nm pitch and below.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    providing a mask including:
        a transparent substrate;
        a first layer of a polarization material provided on the transparent substrate, the first layer formed to allow only light polarized in a first direction to travel therethrough; and
        a second layer of a polarization material provided on the first layer, the second layer formed to allow only light polarized in a second direction to travel therethrough, the second direction being at an angle to the first direction,
        wherein a first region is provided that extends in the first direction and contains the first layer and no second layer, and
        wherein a second region is provided that extends in the second direction and contains the second layer and no first layer; and
    exposing a photoresist layer to light through the mask such that light polarized in the first direction passes through the first region to expose a first-directional region of the photoresist layer used, and light polarized in the second direction passes through the second region to expose a second-directional region of the photoresist layer.

2. The method according to claim 1,
    wherein the mask further includes a third region that extends in a third direction and contains a third layer of a polarization material, the third layer formed to allow light polarized in the third direction to travel therethrough, the third direction being at an angle to the first and second directions, wherein the third region does not contain the first or second layers, and wherein the first and second regions contain no third layer, and wherein exposing the photoresist layer to light through the mask allows light polarized in the third direction to pass through the third region to expose a third-directional region of the photoresist layer.

3. The method according to claim 2, wherein the first direction and the second direction are perpendicular to one another, and wherein the third direction is at a 45° angle to the first direction and the second direction.

4. The method according to claim 1, wherein the first direction and the second direction are perpendicular to one another.

5. The method according to claim 1, wherein the first layer is formed from a dichroic material deposited with an orientation to allow the light polarized in the first direction to travel therethrough, and the second layer is formed from the dichroic material deposited with an orientation to allow light polarized in the second direction to travel therethrough.

6. The method according to claim 1, wherein the first region contains elongated sides that extend in the first direction, and wherein the second region contains elongated sides that extend in the second direction.

7. The method according to claim 1, wherein a masking region containing both the first and second layers is provided in an area not including the first region and the second region.

8. A mask comprising:
a transparent substrate;
a first layer of a polarization material provided on the transparent substrate, the first layer formed to allow light polarized in a first direction to travel therethrough; and
a second layer of a polarization material provided on the first layer, the second layer formed to allow light polarized in a second direction to travel therethrough, the second direction being at an angle to the first direction,
wherein a first region is provided that extends in the first direction and contains the first layer and no second layer, and
wherein a second region is provided that extends in the second direction and contains the second layer and no first layer.

9. The mask according to claim 8, further comprising:
a third region extending in a third direction and containing a third layer of a polarization material, the third layer formed to allow light polarized in the third direction to travel therethrough, the third direction being at an angle to the first and second directions, wherein the third region does not contain the first or second layers,
wherein the first and second regions contain no third layer.

10. The mask according to claim 9, wherein the first direction and the second direction are perpendicular to one another, and wherein the third direction is at a 45° angle to the first direction and the second direction.

11. The mask according to claim 8, wherein the first direction and the second direction are perpendicular to one another.

12. The mask according to claim 8, wherein the first layer is formed from a dichroic material deposited with an orientation to allow light polarized in the first direction to travel therethrough, and the second layer is formed from the dichroic material deposited with an orientation to allow light polarized in the second direction to travel therethrough.

13. The mask according to claim 8, wherein the first region contains elongated sides that extend in the first direction, and wherein the second region contains elongated sides that extend in the second direction.

14. The mask according to claim 8, wherein a masking region containing both the first and second layers is provided in an area not including the first region and the second region.

15. A method comprising:
providing a transparent substrate;
forming a first layer of a polarization material on the transparent substrate, the polarization material of the first layer being oriented to allow light polarized in a first direction to travel therethrough;
removing the first layer from a first region extending in a second direction that is at an angle to the first direction;
forming a second layer of a polarization material on the first layer and in the region, the polarization material of the second layer being oriented to allow light polarized in the second direction to travel therethrough; and
removing the second layer from a second region extending in the first direction.

16. The method according to claim 15, further comprising:
removing both the first layer and the second layer from a third region extending in a third direction that is at an angle to the first and second directions; and
forming a third layer of a polarization material in the third region, the polarization material of the third layer being oriented to allow light polarized in the third direction to travel therethrough.

17. The method according to claim 16, wherein the first direction and the second direction are perpendicular to one another, and wherein the third direction is at a 45° angle to the first direction and the second direction.

18. The method according to claim 15, wherein the first direction and the second direction are perpendicular to one another.

19. The method according to claim 15, comprising forming the first layer by depositing a dichroic material with an orientation to allow light polarized in the first direction to travel therethrough, and forming the second layer by depositing the dichroic material with an orientation to allow light polarized in the second direction to travel therethrough.

20. The method according to claim 15, wherein the first region contains elongated sides that extend in the second direction, and wherein the second region contains elongated sides that extend in the first direction.

* * * * *